(12) United States Patent
Costello et al.

(10) Patent No.: US 8,779,361 B2
(45) Date of Patent: Jul. 15, 2014

(54) OPTICAL PROXIMITY SENSOR PACKAGE WITH MOLDED INFRARED LIGHT REJECTION BARRIER AND INFRARED PASS COMPONENTS

(75) Inventors: James Costello, Singapore (SG); Rani Saravanan, Singapore (SG); Wee Sin Tan, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 497 days.

(21) Appl. No.: 12/495,739

(22) Filed: Jun. 30, 2009

(65) Prior Publication Data
US 2010/0327164 A1  Dec. 30, 2010

(51) Int. Cl.
| | |
|---|---|
| *G01J 5/02* | (2006.01) |
| *H01J 27/14* | (2006.01) |
| *H01L 31/0203* | (2014.01) |
| *H01L 31/167* | (2006.01) |
| *H01L 31/173* | (2006.01) |
| *H01L 33/56* | (2010.01) |

(52) U.S. Cl.
CPC ............ *H01L 31/167* (2013.01); *H01L 31/173* (2013.01); *H01L 33/56* (2013.01)
USPC .................... 250/338.1; 250/339.06; 250/216; 257/81; 257/82

(58) Field of Classification Search
CPC ..... H01L 31/173; H01L 33/56; H01L 31/167; H01L 25/167; H01L 25/0753; H01L 31/0203; G08B 13/18
USPC ............ 250/216, 338.1, 339.06; 257/82, 678, 257/660, 99, 81, 100
See application file for complete search history.

(56) References Cited

U.S. PATENT DOCUMENTS

| | | | |
|---|---|---|---|
| 5,155,777 | A | 10/1992 | Angelopoulos et al. |
| 5,367,393 | A | 11/1994 | Ohara et al. |
| 5,567,953 | A | 10/1996 | Horinouchi et al. |
| 5,675,143 | A | 10/1997 | Heimlicher |

(Continued)

FOREIGN PATENT DOCUMENTS

| | | |
|---|---|---|
| CN | 1743886 | 8/2006 |
| CN | 1832217 | 9/2006 |

(Continued)

OTHER PUBLICATIONS

"Agilent HSDL-9100 Miniature Surface-Mount Proximity Sensor Data Sheet", In current form on Dec. 21, 2007.

(Continued)

*Primary Examiner* — David Porta
*Assistant Examiner* — Yara B Green

(57) ABSTRACT

An optical proximity sensor is provided that comprises an infrared light emitter an infrared light detector, a first molded optically transmissive infrared light pass component disposed over and covering the light emitter and a second molded optically transmissive infrared light pass component disposed over and covering the light detector. Located in-between the light emitter and the first molded optically transmissive infrared light pass component, and the light detector and the second molded optically transmissive infrared light pass component is a substantially optically non-transmissive infrared light barrier component. The infrared light barrier component substantially attenuates or blocks the transmission of undesired direct, scattered or reflected light between the light emitter and the light detector, and thereby minimizes optical crosstalk and interference between the light emitter and the light detector.

27 Claims, 10 Drawing Sheets

(56) References Cited

U.S. PATENT DOCUMENTS

| | | | |
|---|---|---|---|
| 5,760,390 | A | 6/1998 | Vezzalini et al. |
| 5,811,797 | A | 9/1998 | Kobachi et al. |
| 6,064,062 | A | 5/2000 | Bohn |
| 6,135,816 | A | 10/2000 | Mashiyama et al. |
| 6,180,881 | B1 | 1/2001 | Isaak |
| 6,364,706 | B1 | 4/2002 | Ando et al. |
| 6,572,410 | B1 | 6/2003 | Volstorf et al. |
| 6,635,955 | B2 | 10/2003 | Scheidle |
| 6,674,653 | B1 | 1/2004 | Valentine |
| 6,677,934 | B1 | 1/2004 | Blanchard |
| 6,740,862 | B2 | 5/2004 | Paritsky et al. |
| 6,771,671 | B1 | 8/2004 | Fields et al. |
| 6,855,933 | B2 | 2/2005 | Stone et al. |
| 6,885,300 | B1 | 4/2005 | Johnston et al. |
| 7,026,710 | B2 | 4/2006 | Coyle et al. |
| 7,172,126 | B2 | 2/2007 | Schmidt et al. |
| 7,229,295 | B2 | 6/2007 | Ice et al. |
| 7,256,483 | B2 * | 8/2007 | Epler et al. ............ 257/676 |
| 7,258,264 | B2 | 8/2007 | Ice et al. |
| 7,277,012 | B2 | 10/2007 | Johnston et al. |
| 7,289,142 | B2 | 10/2007 | Silverbrook |
| 7,348,636 | B2 | 3/2008 | Chang et al. |
| 7,387,033 | B2 | 6/2008 | Qing et al. |
| 7,387,907 | B2 | 6/2008 | Hsu et al. |
| 7,427,806 | B2 | 9/2008 | Arndt et al. |
| 7,485,818 | B2 | 2/2009 | Chou |
| 7,510,888 | B2 | 3/2009 | Guenther et al. |
| 7,514,666 | B2 | 4/2009 | Yee et al. |
| 7,582,513 | B2 | 9/2009 | Kroeninger et al. |
| 7,675,132 | B2 | 3/2010 | Waitl et al. |
| 7,755,029 | B2 | 7/2010 | Tang et al. |
| 7,767,485 | B2 | 8/2010 | Ogawa et al. |
| 7,851,246 | B2 | 12/2010 | Camacho |
| 8,026,472 | B2 | 9/2011 | Arnold |
| 8,031,174 | B2 | 10/2011 | Hamblin et al. |
| 8,097,852 | B2 | 1/2012 | Yao |
| 8,143,608 | B2 | 3/2012 | Yao et al. |
| 8,207,517 | B2 | 6/2012 | Wang et al. |
| 8,275,922 | B2 | 9/2012 | Barrett et al. |
| 8,420,999 | B2 | 4/2013 | Costello et al. |
| 8,575,537 | B2 | 11/2013 | Yao et al. |
| 2002/0172472 | A1 * | 11/2002 | Nelson et al. ............ 385/88 |
| 2004/0065894 | A1 | 4/2004 | Hashimoto et al. |
| 2005/0088900 | A1 | 4/2005 | Chan |
| 2005/0110157 | A1 | 5/2005 | Sherrer et al. |
| 2005/0199786 | A1 | 9/2005 | Yoshida et al. |
| 2006/0016994 | A1 | 1/2006 | Basoor et al. |
| 2006/0017069 | A1 | 1/2006 | Bergmann |
| 2006/0022212 | A1 | 2/2006 | Waitl et al. |
| 2006/0022215 | A1 | 2/2006 | Arndt et al. |
| 2006/0045530 | A1 | 3/2006 | Lim et al. |
| 2006/0049533 | A1 * | 3/2006 | Kamoshita ............ 264/1.7 |
| 2006/0118807 | A1 | 6/2006 | Ives |
| 2007/0045524 | A1 * | 3/2007 | Rains et al. ............ 250/228 |
| 2007/0072321 | A1 | 3/2007 | Sherrer et al. |
| 2007/0085157 | A1 | 4/2007 | Fadell |
| 2007/0246646 | A1 * | 10/2007 | Lum et al. ............ 250/231.13 |
| 2008/0006762 | A1 * | 1/2008 | Fadell et al. ............ 250/201.1 |
| 2008/0011939 | A1 * | 1/2008 | Yee et al. ............ 250/214 AL |
| 2008/0011940 | A1 | 1/2008 | Zhang et al. |
| 2008/0012033 | A1 | 1/2008 | Arndt |
| 2008/0030878 | A1 | 2/2008 | Saxena et al. |
| 2008/0049210 | A1 * | 2/2008 | Takaoka ............ 356/3 |
| 2008/0116379 | A1 * | 5/2008 | Teder ............ 250/341.1 |
| 2008/0118241 | A1 | 5/2008 | TeKolste et al. |
| 2008/0165115 | A1 | 7/2008 | Herz et al. |
| 2008/0173790 | A1 | 7/2008 | Cheng et al. |
| 2008/0173963 | A1 | 7/2008 | Hsu et al. |
| 2008/0197376 | A1 | 8/2008 | Bert et al. |
| 2008/0223934 | A1 | 9/2008 | Havens |
| 2008/0265266 | A1 | 10/2008 | Bogner et al. |
| 2008/0296478 | A1 | 12/2008 | Hernoult |
| 2008/0308738 | A1 | 12/2008 | Li et al. |
| 2008/0308917 | A1 | 12/2008 | Pressel et al. |
| 2009/0027652 | A1 | 1/2009 | Chang et al. |
| 2009/0057799 | A1 | 3/2009 | Chan et al. |
| 2009/0101804 | A1 | 4/2009 | Le |
| 2009/0129783 | A1 | 5/2009 | Ori et al. |
| 2009/0159900 | A1 | 6/2009 | Basoor |
| 2009/0168088 | A1 | 7/2009 | Rosenblatt |
| 2009/0267173 | A1 | 10/2009 | Takahashi et al. |
| 2010/0030039 | A1 | 2/2010 | Lamego et al. |
| 2010/0246771 | A1 | 9/2010 | Hawver et al. |
| 2010/0282951 | A1 | 11/2010 | Costello et al. |
| 2010/0327164 | A1 | 12/2010 | Costello et al. |
| 2011/0024627 | A1 | 2/2011 | Yao |
| 2011/0057102 | A1 | 3/2011 | Yao |
| 2011/0057104 | A1 | 3/2011 | Yao et al. |
| 2011/0057128 | A1 | 3/2011 | Guenter et al. |
| 2011/0057129 | A1 | 3/2011 | Yao |
| 2011/0121181 | A1 | 5/2011 | Costello |
| 2011/0204233 | A1 | 8/2011 | Costello |
| 2011/0297831 | A1 | 12/2011 | Yao et al. |
| 2012/0070145 | A1 | 3/2012 | Wong et al. |
| 2012/0160994 | A1 | 6/2012 | Costello et al. |

FOREIGN PATENT DOCUMENTS

| | | |
|---|---|---|
| EP | 1455564 | 9/2004 |
| GB | 2486000 | 6/2012 |
| JP | 63308973 | 12/1988 |
| WO | WO-2006045531 | 5/2006 |
| WO | WO-2009/072786 | 6/2009 |
| WO | WO-2009072786 | 6/2009 |
| WO | WO-2012068213 | 5/2012 |

OTHER PUBLICATIONS

Avago Technologies, "ADPS-9101—Integrated Reflective Sensor", Data Sheet 2007.

Avago Technologies, "HSDL-9100—Surface-Mount Proximity Sensor", Data Sheet 2006.

Costello, et al., "U.S. Appl. No. 12/495,739", *Optical Proximity Sensor Package with Molded Infrared Light Rejection Barrier and Infrared Pass Components* Jun. 30, 2009.

IDES—The Plastic Web, "Si Photo Diode Chip", Dec. 19, 2007.

Losee, et al., "A 1/3 Format Image Sensor with Refractory Metal Light Shield for Color Video Applications", *Solid State Circuits Conference, Digest of Technical Papers, 36th ISSCC, IEEE International Volume*. Feb. 1989, 90-91.

Tan, et al., "U.S. Appl. No. 12/623,767", *Infrared Proximity Sensor Package with Improved Crosstalk Isolation*, filed Nov. 23, 2009, 30 pages.

Tyntek, "Data Sheet for AlGaAs/GaAs Infrared Chip", TK 114IRA Mar. 2004.

Tyntek, "Si Photo-Diode Chip—TK043PD Data Sheet", Dec. 19, 2007.

Xydar, "G-930—Solvay Advanced Polymers—Liquid Crystal Polymer Data Sheet", Reproduced from website at www.ides.com/grades/ds/E22219.htm on Dec. 17, 2007.

Penchem Technologies Data Sheet for Penchem OP 580—IR Filter Optoelectronic Epoxy, Apr. 2009.

Penchem Technologies Data Sheet for Penchem OP 5790—IR Pass Optoelectronic Epoxy Apr. 2009.

Technical Data Sheet, Nitto Denko Corporation, NT-MB-IRL3801, 2008.

Technical Data Sheet, Nitto Denko Corporation, NT-8506, 2001.

Avago Technologies ADPS-9120 Integrated Optical Proximity Sensors Prelim Datasheet. Feb. 25, 2009.

Avago Technologies APDS-9800 Integrated Ambinet Light and Proximity Sensor Prelim Datasheet, Mar. 2, 2009.

Avago Technologies, "APDS-9005 Miniature Surface-Mount Ambient Light Photo Sensor", Jan. 2007.

Avago Technologies, "APDS-9700 Signal Conditioning IC for Optical Proximity Sensors", Jan. 4, 2008.

AZ Optics, "Device Debuts as the World's Best-Performing Integrated Light/Proximity Sensor", Nov. 11, 2008.

Ishihara, et al., "A Dual Face Package Using a Post with Wire Components: Novel Structure for PoP Wafer Level CSP and Compact Image Sensor Package", *Electronic Components and Technology Conference* 2008, 1093-1098.

(56) References Cited

OTHER PUBLICATIONS

Khamal, Ibrahim, "Infra-Red Proiximilty Sensor (II)", Apr. 4, 2008.
Tyntek, "Data Sheet for AlGaAs/GaAs Infrared Chip", TK116IRA, Nov. 2006.
Tyntek, "Data Sheet for Si Photo-diode Chip", TK 043PD, Jun. 2004.
A "APDS-9900 and APDS-9901 Digital Proximity and Ambient Light Sensor", Mar. 23, 2011.
Avago Technologies, , "Integrated Digital Proximity Sensors", *APDS 9120*, Data Sheet Mar. 3, 2009.
Avago Technologies, "Avago Technologies Announces Ultra-Thin Integrated Ambient Light and Proximity Sensor Module for Use in Mobile Phones", *Wireless Design and Development* Nov. 27, 2009.
"A4 Masking Sheet—A4 Masking Sheet" Downloaded from website: <http://www.stix2.com.au/a4-masking-sheet-13/a4-masking-sheet.html> 2012, Product Description 2012.
"Altera 40/100 Gigabit Ethernet", *Altera Corporation Product Sheet Copyright 1995-2012,* 3 pages 2012.
"Altera's 10-Gbps Ethernet (XAUI) Solution", *Altera Corporation Product Sheet*, Copyright 1995-2012, 2 pages 2012.
"Nordson Ink-Dot I.D. System", *Nordson Corporation Product Sheet 2012,* 2 pages 2012.
"SerialLite II Protocol", *Altera Reference Manual* Oct. 2005, 84 pages 2005.
Morgavi, Paul , "Panasonic Print Head Technology and Market Applications", *IMI Europe, Digital Printing Conferences 2007, Presentation,* Nov. 7-9, 2007, 24 pages 2007.

* cited by examiner

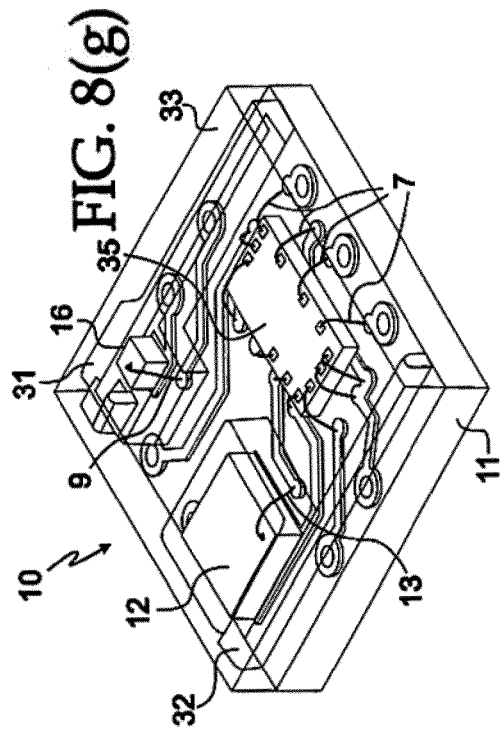
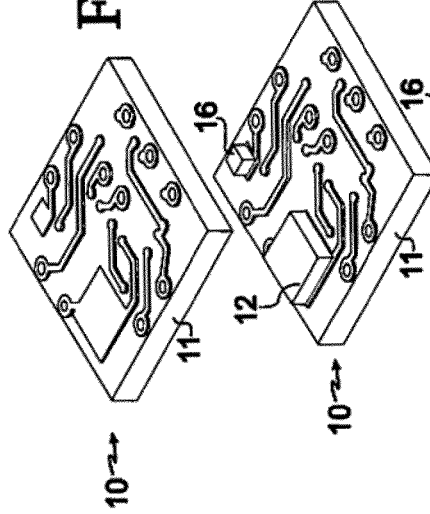
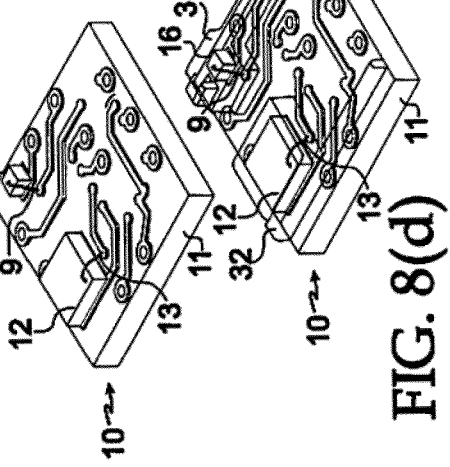
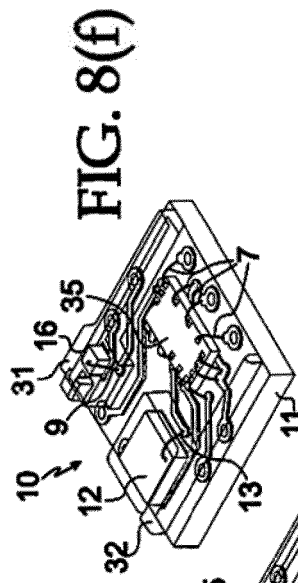
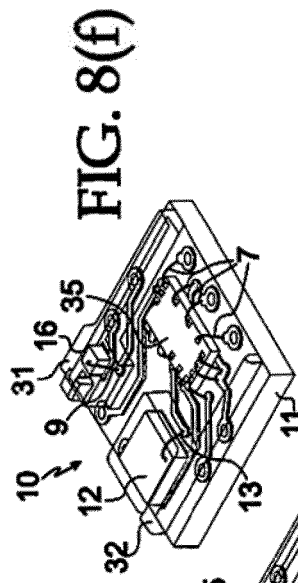
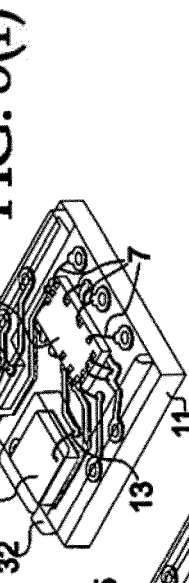
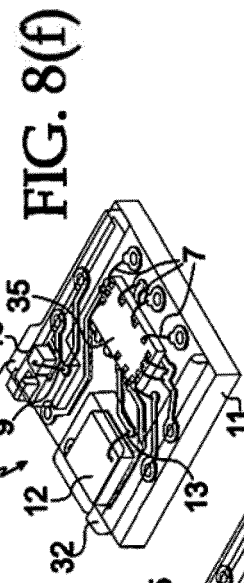

OPTICAL PROXIMITY SENSOR PACKAGE WITH MOLDED INFRARED LIGHT REJECTION BARRIER AND INFRARED PASS COMPONENTS

FIELD OF THE INVENTION

Various embodiments of the inventions described herein relate to the field of proximity sensors, and components, devices, systems and methods associated therewith.

BACKGROUND

Optical proximity sensors, such as the AVAGO TECHNOLOGIES™ HSDL-9100 surface-mount proximity sensor, the AVAGO TECHNOLOGIES™ APDS-9101 integrated reflective sensor, the AVAGO TECHNOLOGIES™ APDS-9120 integrated optical proximity sensor, and the AVAGO TECHNOLOGIES™ APDS-9800 integrated ambient light and proximity sensor, are known in the art. Such sensors typically comprise an integrated high efficiency infrared emitter or light source and a corresponding photodiode or light detector, and are employed in a large number of hand-held electronic devices such as mobile phones, Personal Data Assistants ("PDAs"), laptop and portable computers, portable and handheld devices, amusement and vending machines, industrial automation machinery and equipment, contactless switches, sanitary automation machinery and equipment, and the like.

Referring to FIG. 1, there is shown a prior art optical proximity sensor 10 comprising infrared light emitter 16, light emitter driving circuit 51, light detector or photodiode 12, light detector sensing circuit 53, metal housing or shield 18 with apertures 55 and 57, and object to be sensed 60. Light rays 15 emitted by emitter 16 and reflected as light rays 19 from object 60 (which is in relatively close proximity to optical proximity sensor 10) are detected by photodiode 12 and thereby provide an indication that object 60 is close or near to sensor 10.

As further shown in FIG. 1, optical proximity sensor 10 further comprises metal housing or shield 18 formed of metal and comprising apertures 55 and 57 located over light emitter 16 and light detector 12, respectively, such that at least a first portion of light 15 emitted by light detector 12 passes through aperture 55, and at least a second portion of the first portion 19 of light reflected from object 50 in proximity to sensor 10 passes through aperture 57 for detection by light detector 12. As shown, metal housing or shield 18 may further comprise first and second modules 61 and 63 within which light emitter 16 and light detector 12 are disposed, respectively. The first and second modules 61 and 63 comprise adjoining optically opaque metal inner sidewalls 25 to provide optical isolation between first and second modules 61 and 63.

Many optical proximity sensors generally include a metal shield, such as shield or housing 18 of the type shown in FIG. 1 to provide optical isolation between light emitter 16 and light detector or photodiode 12 so that undesired optical cross-talk between emitter 16 and detector 12 is minimized. See, for example, the Data Sheets corresponding to the AVAGO TECHNOLOGIES™ APDS-9120 Integrated Optical Sensors Preliminary Datasheet and the AVAGO TECHNOLOGIES™ APDS-9800 Integrated Ambient Light and Proximity Sensors Preliminary Datasheet, each of which is hereby incorporated by reference herein, each in its respective entirety.

FIG. 2 shows a prior art optical proximity sensor 10 with metal shield or housing 18. The optical proximity sensor shown in FIG. 2 is an AVAGO TECHNOLOGIES™ APDS-9120 Integrated Optical Proximity Sensor, which contains a molded plastic substrate 11 upon which are mounted LED 16 and light detector or photodiode 12. Single-piece metal shield 18 covers LED 16 and light detector or photodiode 12 and contains a downwardly projecting light barrier 65 disposed therebetween (not shown in FIG. 2). Electrical contacts 17 provide a means to establish electrical connections between proximity sensor 10 and external devices. In the APDS-9120 optical proximity sensor, metal shield 18 is formed and thinned using conventional metal stamping techniques, and is affixed to the underlying plastic substrate 11 by gluing. The APDS-9120 sensor has an areal footprint of only 4 mm by 4 mm, and thus is quite small.

FIG. 3 shows a prior art optical proximity sensor 10 with a more complicated metal shield or housing 18 than that of FIG. 2. The optical proximity sensor shown in FIG. 3 is an AVAGO TECHNOLOGIES™ APDS-9800 Integrated Ambient Light and Proximity Sensor, which contains a printed circuit board ("PCB") substrate 11 upon which are mounted LED 16, light detector or photodiode 12, and ambient light sensor 14. The two-piece metal shield 18 covers LED 16, light detector or photodiode 12, and ambient light sensor 14 and contains a downwardly projecting light barrier 65 disposed therebetween. In the APDS-9800 optical proximity sensor, metal shield 18, being of a considerably more complicated shape and geometry than that of FIG. 2, is formed and thinned using more advanced progressive metal stamping techniques, and must be hand-fitted and attached to the underlying PCB by gluing to ensure proper alignment and fit.

As will now be seen, at least some optical proximity sensors of the prior art rely upon the use of an externally mounted metal shield 18, which is required to reduce the amount of crosstalk or interference that might otherwise occur between LED 16 and light detector 12, as well as to help increase the detection distance of the device. Metal shields 18 are quite small, however, making them difficult to manufacture in high volumes, and thus expensive to fabricate. Such metal shields 18 also generally require expensive automated equipment to attach same to sensors 10 in a mass production setting. Moreover, the quality of metal shields 18 often varies, and issues commonly arise with suppliers being unable to meet the tight dimensional tolerances required for such small devices. Metal shields 18 can also detach from sensor 10, thereby adding another failure point for sensor 10.

What is need is an optical proximity sensor design that eliminates the need to include a metal shield 18, but which retains high crosstalk and interference rejection characteristics so that an optical proximity sensor can be provided that features improved performance, lower cost, increased manufacturability and improved reliability.

SUMMARY

In some embodiments, there is provided an optical proximity sensor comprising an infrared light emitter operably connected to and driven by a light emitter driving circuit, a light detector operably connected to and driven by a detector sensing circuit, a first molded optically transmissive infrared light pass component disposed over and covering the light emitter, a second molded optically transmissive infrared light pass component disposed over and covering the light detector, and a molded substantially optically non-transmissive infrared light barrier component disposed between the first and second optically transmissive infrared light pass components, wherein at least a first portion of light emitted by the light detector passes through the first component, and at least a second portion of the first portion of light reflected from an object of interest in proximity to the sensor passes through the second component for detection by the light detector, and the infrared light barrier component substantially attenuates or blocks the transmission of undesired direct, scattered or reflected light between the light emitter and the light detector and thereby minimizes optical crosstalk and interference between the light emitter and the light detector.

In other embodiments, there is provided a method of making an optical proximity sensor comprising mounting an infrared light emitter on a substrate, mounting an infrared light detector on the substrate, the infrared light detector being spaced apart from the infrared light emitter on the substrate, molding or casting a first optically transmissive infrared light pass component over and covering the light emitter, molding or casting a second optically transmissive infrared light pass component over and covering the light detector, and molding or casting a substantially optically non-transmissive infrared light barrier component between the first and second optically transmissive infrared light pass components.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

FIGS. 8(a) through 8(g) illustrate a method of making an optical proximity sensor according to one embodiment;

The drawings are not necessarily to scale. Like numbers refer to like parts or steps throughout the drawings, unless otherwise noted.

DETAILED DESCRIPTIONS OF SOME PREFERRED EMBODIMENTS

Figure 1:
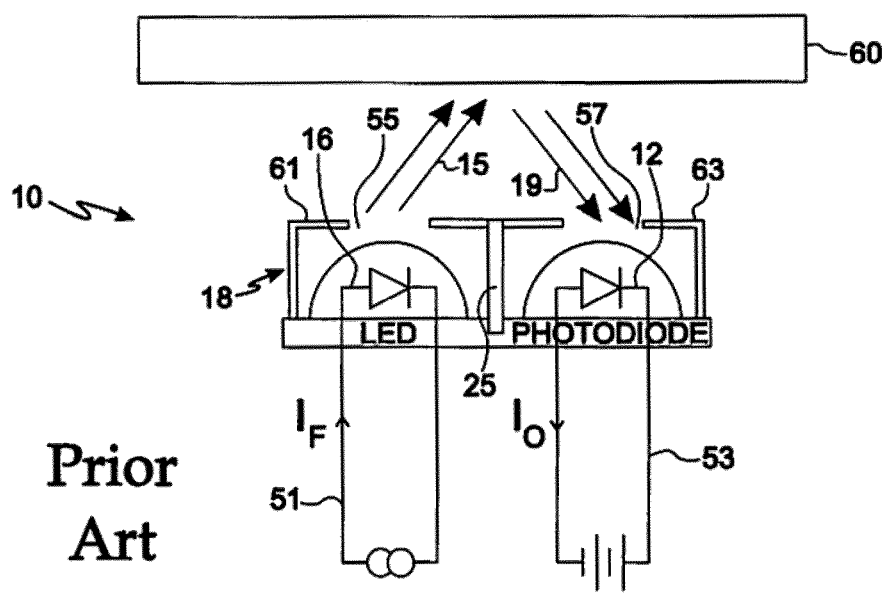
FIG. 1 shows a prior art optical proximity sensor and associated circuitry.
Figure 2:
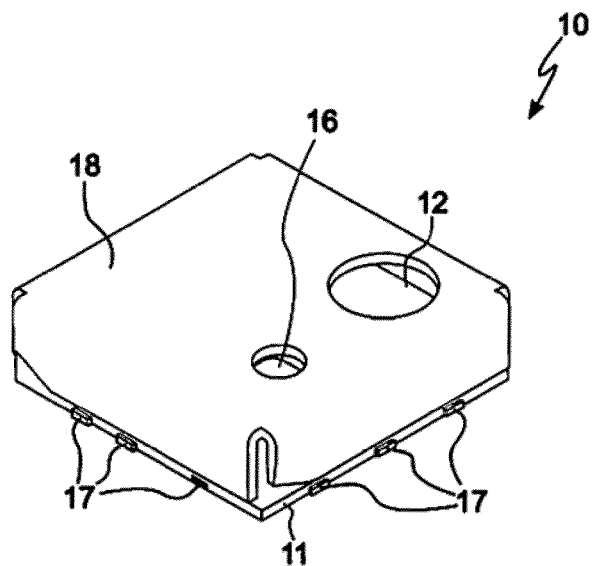
FIG. 2 shows a prior art optical proximity sensor with a metal shield or housing.
Figure 3:
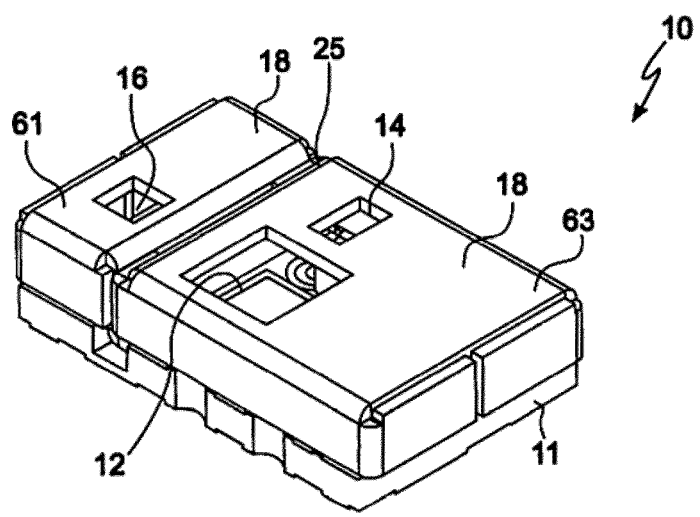
FIG. 3 shows a prior art optical proximity sensor with a more complicated metal shield or housing than that shown in FIG. 2.
Figure 4:
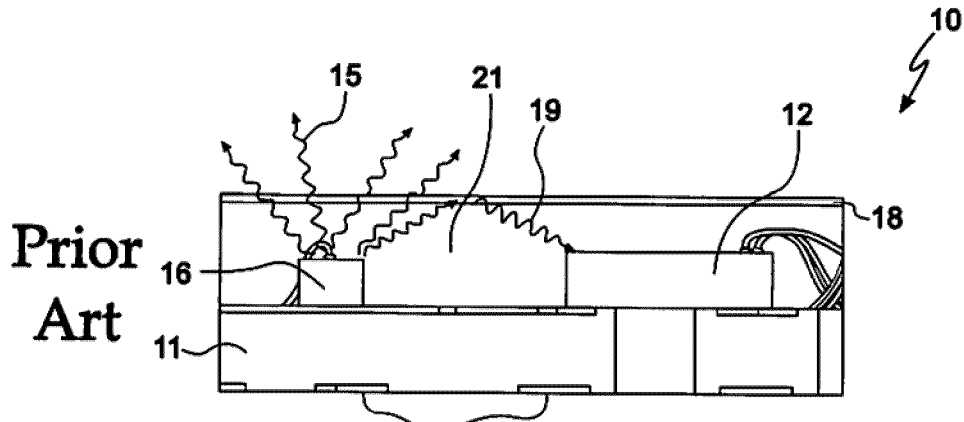
FIG. 4 shows an optical proximity sensor comprising a light emitter mounted on a substrate and separated from a light detector by an optically transmissive material.

Referring now to FIG. 4, there is shown an optical proximity sensor 10 comprising light emitter 16 mounted on substrate 11 and separated from light detector 12 by optically transmissive material 21, which is a single mold two-part epoxy or transfer molding compound. As shown in FIG. 4, while light rays 15 are transmitted through material 21, other reflected, diffracted or refracted IR radiation 19 can leak across to light detector 12 through single mold compound 21, which manifests itself as undesired crosstalk or interference between light emitter 16 and light detector 12, thereby degrading the performance of proximity sensor 10.

Figure 5:
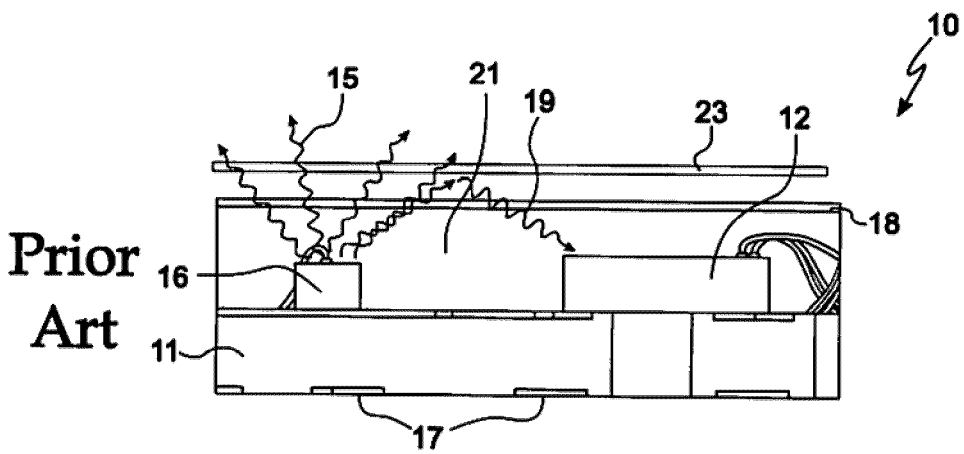
FIG. 5 shows an optical proximity sensor comprising a light emitter mounted on a substrate and separated from a light detector by an optically transmissive material, and a window disposed above the optical proximity sensor.

As further shown in FIG. 5, the amount of reflected, diffracted or refracted IR radiation 19 and undesired crosstalk or interference between light emitter 16 and light detector 12 is typically exacerbated by the presence of window 23, which in some applications is provided as part of the portable or other type of electronic device in which proximity sensor 10 is housed and mounted.

Figure 6:
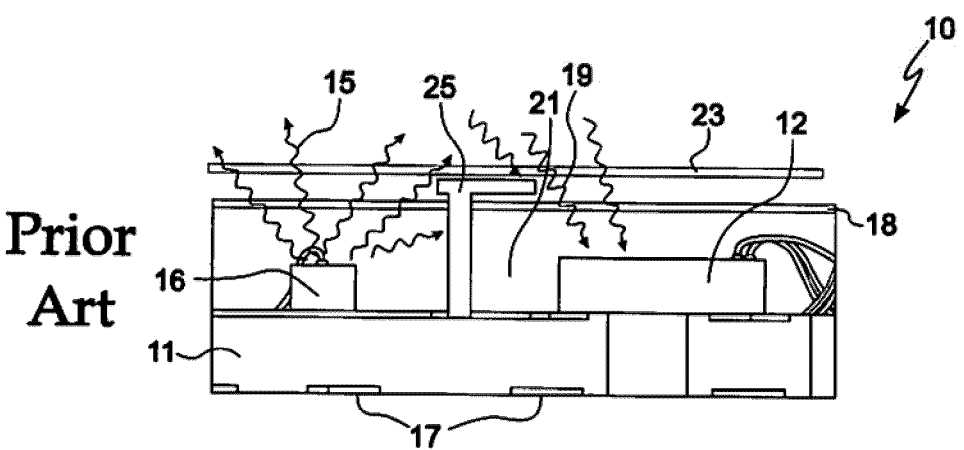
FIG. 6 shows an optical proximity sensor comprising a light emitter mounted on a substrate and separated from a light detector by a metal light barrier.

As shown in FIG. 6, the problems arising from undesired crosstalk or interference caused by reflected, diffracted or refracted IR radiation 19 may be reduced by disposing a metal light barrier 25 between light emitter 16 and light detector 12. Providing such a metal barrier 25 in proximity sensor 10, however, presents problems respecting increased manufacturing costs and complexity.

Figure 7:
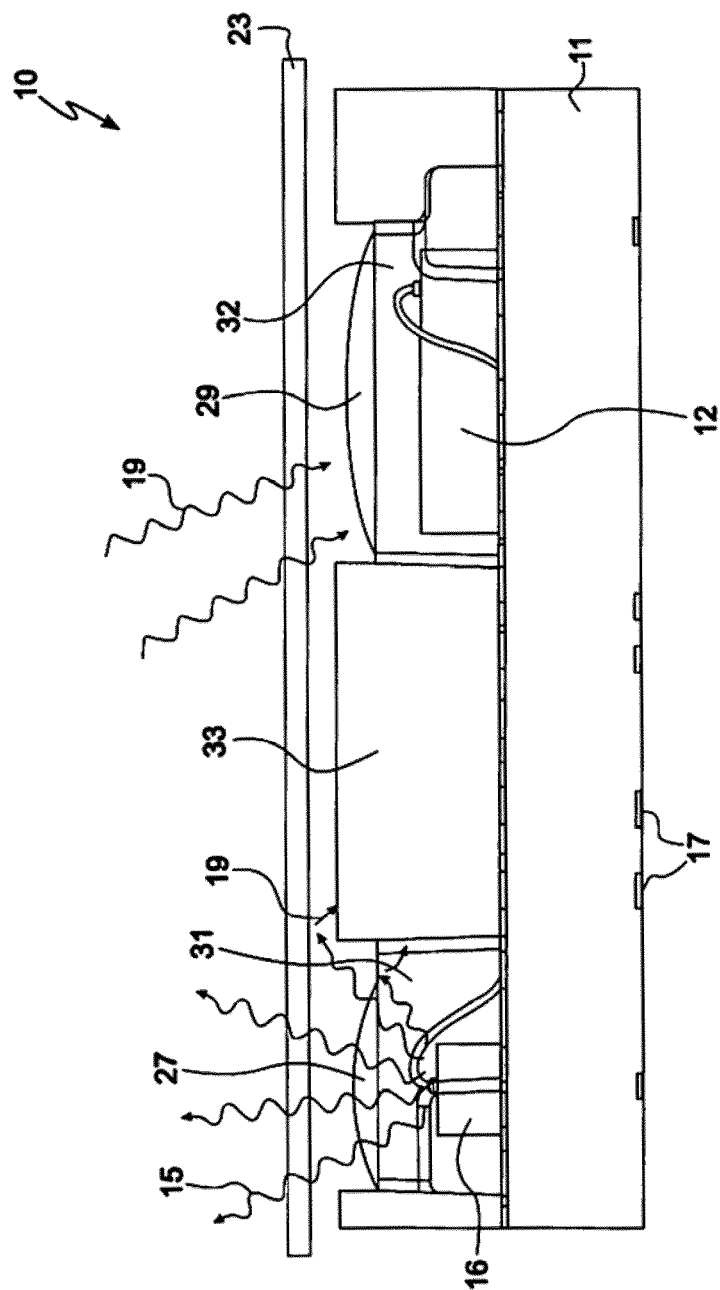
FIG. 7 shows one embodiment of an optical proximity sensor that eliminates the need for a metal barrier disposed between the light emitter and the light detector.

FIG. 7 shows one embodiment that provides solutions to the foregoing problems, where metal barrier 25 is eliminated altogether. Continuing to refer to FIG. 7, there is shown optical proximity sensor 10 comprising infrared light emitter 16 (which is operably connected to and driven by a light emitter driving circuit, the details of which are not shown in FIG. 7), and light detector 12 (which is operably connected to and driven by a detector sensing circuit, the details of which are not shown in FIG. 7). A first molded optically transmissive infrared light pass component 31 is disposed over and covers light emitter 16 and a second molded optically transmissive infrared light pass component 31 is disposed over and covers light detector 12. Optical lenses 27 and 29, preferably formed of the same material, and formed at the same time during the manufacturing process as first and second molded optically transmissive infrared light pass components 31 and 32, are disposed over light emitter 16 and light detector 12, respectively. Located in-between light emitter 16 and first molded optically transmissive infrared light pass component 31, and light detector 12 and second molded optically transmissive infrared light pass component 32, is substantially optically non-transmissive infrared light barrier component 33. At least a first portion of light 15 emitted by light detector 16 passes through first component 31, and at least a second portion 19 of the first portion of light 15 reflected from an object of interest in proximity to proximity sensor 10 passes through second component 32 for detection by light detector 12. Infrared light barrier component 33 substantially attenuates or blocks the transmission of undesired direct, scattered or reflected light between light emitter 16 and light detector 12, and thereby minimizes optical crosstalk and interference between light emitter 16 and light detector 12.

According to one embodiment, first and second molded optically transmissive infrared light pass components 31 and 32 are formed using an infrared-pass and optically transmissive transfer molding compound such as NITTO DENKO™ NT-8506 clear transfer molding compound 8506 or PENCHEM Technologies™ OP 579 infrared pass optoelectronic epoxy. Other suitable optically transmissive epoxies, plastics, polymers or other materials may also be employed. In some embodiments, and as discussed in further detail below, optically transmissive infrared light pass components 31 and 32 are molded during the same manufacturing step, or may be molded separately. See Technical Data Sheet NT-8506 entitled "Clear Transfer Molding Compound NT-8506" dated 2001 and PENCHEM OP 579 IR Pass Optoelectronic Epoxy Data Sheet, Revision 1, dated April, 2009, both of which documents are hereby incorporated by reference herein, each in its respective entirety.

In one embodiment, molded substantially optically non-transmissive infrared light barrier component 33 is formed using an infrared-blocking, filtering or cutting transfer molding compound such as NITTO DENKO™ NT-MB-IRL3801 two-part epoxy resin material or PENCHEM Technologies™ OP 580 infrared filter optoelectronic epoxy, either of which preferably contains an amount of an infrared cutting material that has been selected by the user to achieve acceptable infrared light blocking performance while minimizing the amount of such infrared cutting material employed to keep costs to a minimum. Other suitable optically non-transmissive epoxies, plastics, polymers or other materials may also be employed. See Technical Data Sheet NT-MB-IRL3801 published by DENKO™ dated 2008 and PENCHEM OP 580 IR Filter Optoelectronic Epoxy Data Sheet, Revision 1, dated April, 2009, both of which documents are hereby incorporated by reference herein, each in its respective entirety.

As further shown in FIG. 7, infra-red rays 15 emitted by light emitter or LED 16 exit sensor 10 and return to light detector 12 as rays 19, thereby permitting detection of the nearby object that is to be detected. Light rays reflected from the surface of molded component 31 are blocked from reaching light detector 12 by molded substantially optically non-transmissive infrared light barrier component 33. Light rays that are reflected from window 23 are also blocked by molded substantially optically non-transmissive infrared light barrier component 33. Total Internal Reflection between components 31, 32 and 33 helps improve the performance of proximity sensor 10. As will now be seen, the embodiment of sensor 10 shown in FIG. 7 eliminates the need to provide metal shield 25 of FIG. 6, while improving the optical performance of sensor 10 by reducing crosstalk and interference, as undesired reflected, refracted or diffracted light rays cannot penetrate and travel through to light detector 12.

FIGS. 8(a) through 8(g) illustrate a method of making optical proximity sensor 10 according to one embodiment. As shown in FIG. 8(a), bare substrate 11 (which in one embodiment is a printed circuit board or PCB) is first provided. As shown in FIG. 8(b), light emitter die or LED 16 and light detector die 12 are attached to substrate 11. In FIG. 8(c), light emitter die or LED 16 and light detector die 12 are wire-bonded to substrate 11. Next, and as shown in FIG. 8(d), first and second optically transmissive infrared light pass components 31 and 32 are molded over light emitter 16 and light detector 12 using a suitable infrared-pass and optically transmissive transfer molding compound. In FIG. 8(e), integrated circuit 35 is attached to substrate 11, where integrated circuit 35 contains the electronic circuitry required to drive light emitter 16, and process output signals provided by light detector 12, and optionally contains ambient light sensor 14 (not shown in FIGS. 8(a) through 8(g)). In FIG. 8(f), integrated circuit 35 is wire-bonded to substrate 11. Finally, in FIG. 8(g) substantially optically non-transmissive infrared light barrier component 33 is molded between first and second optically transmissive infrared light pass components 31 and 32, and is preferably configured and compatible in respect of molded first and second optically-transmissive components 31 and 32 to bond thereto without delaminating under normal operating conditions.

Figure 9A:
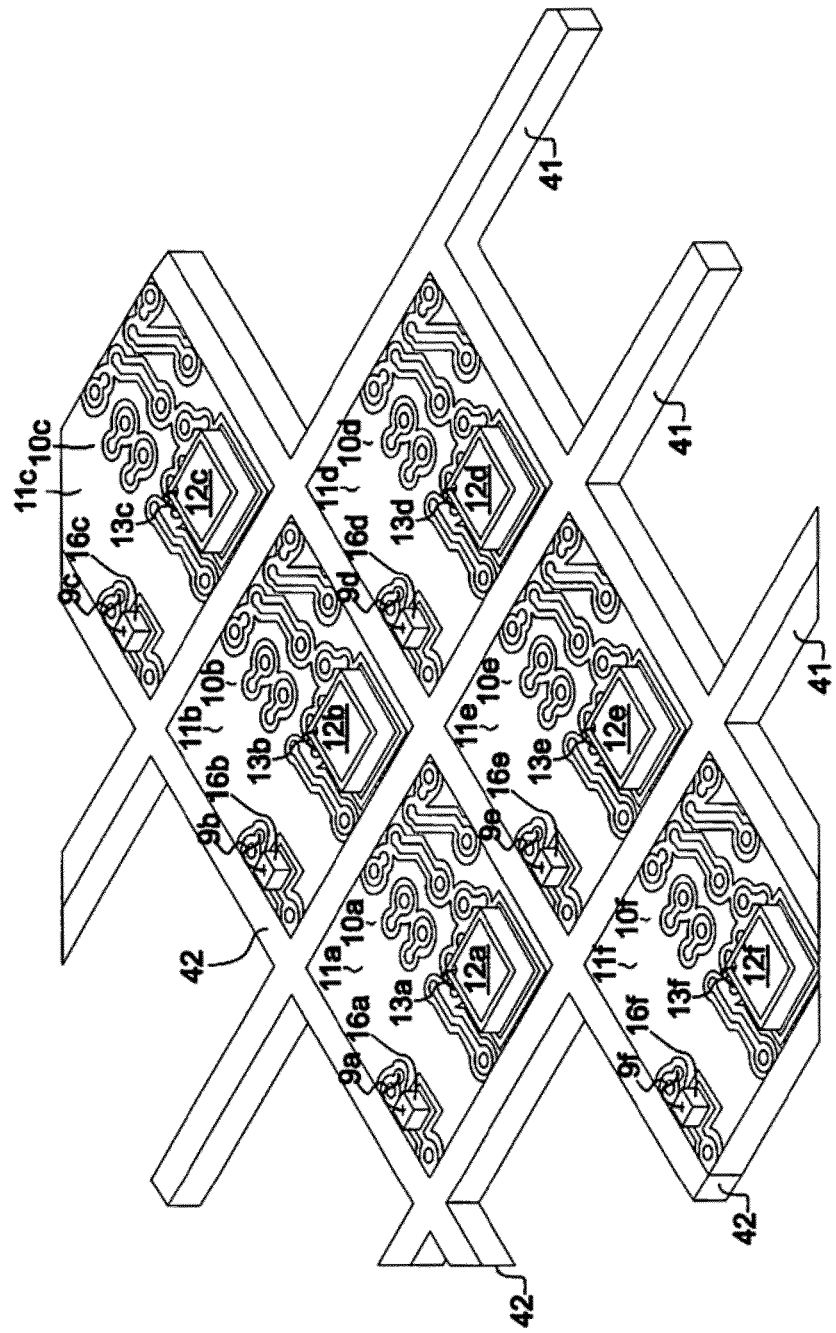
FIGS. 9(a) through 9(d) show another method of making an optical proximity sensor according to one embodiment.
Figure 9B:
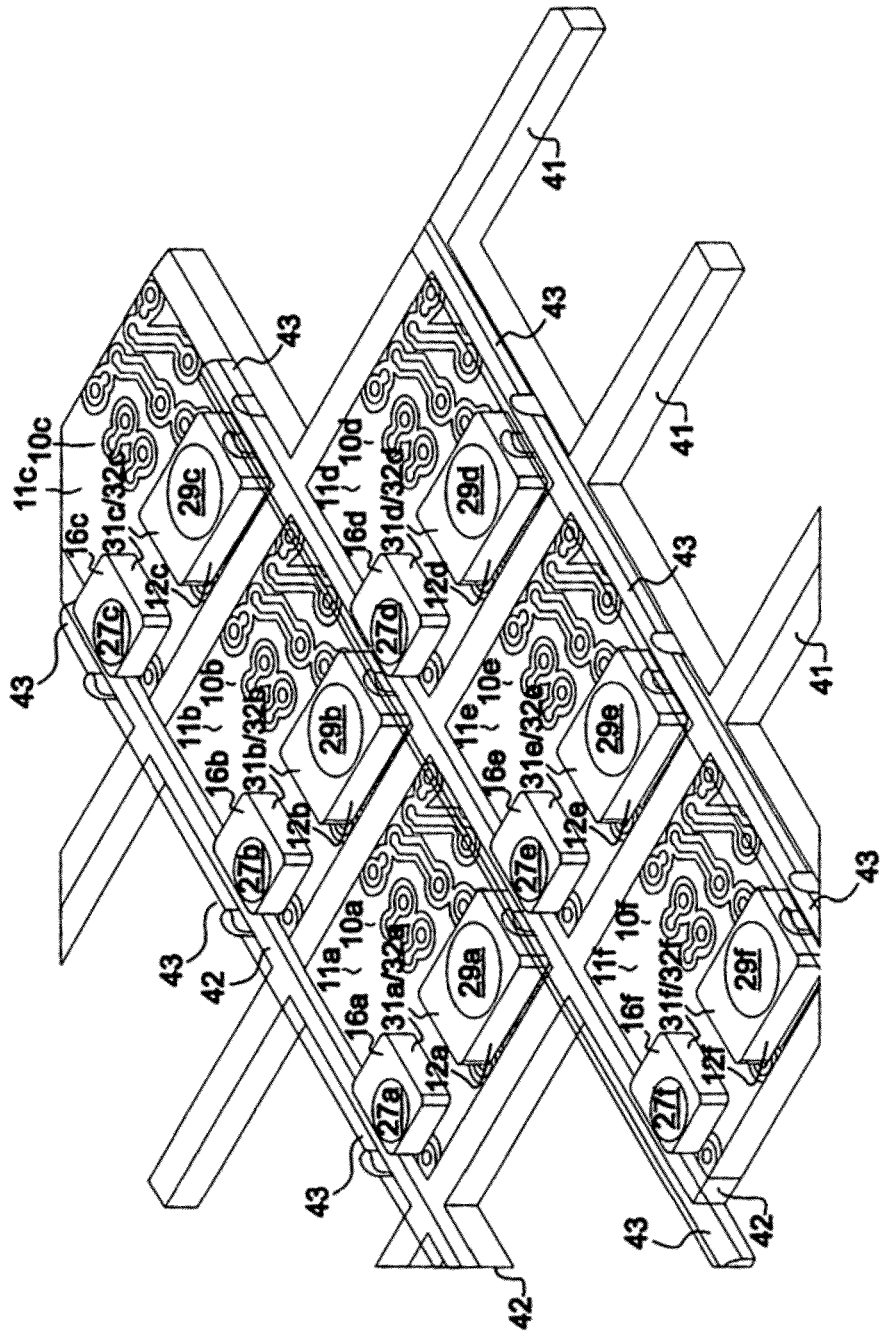
Figure 9C:
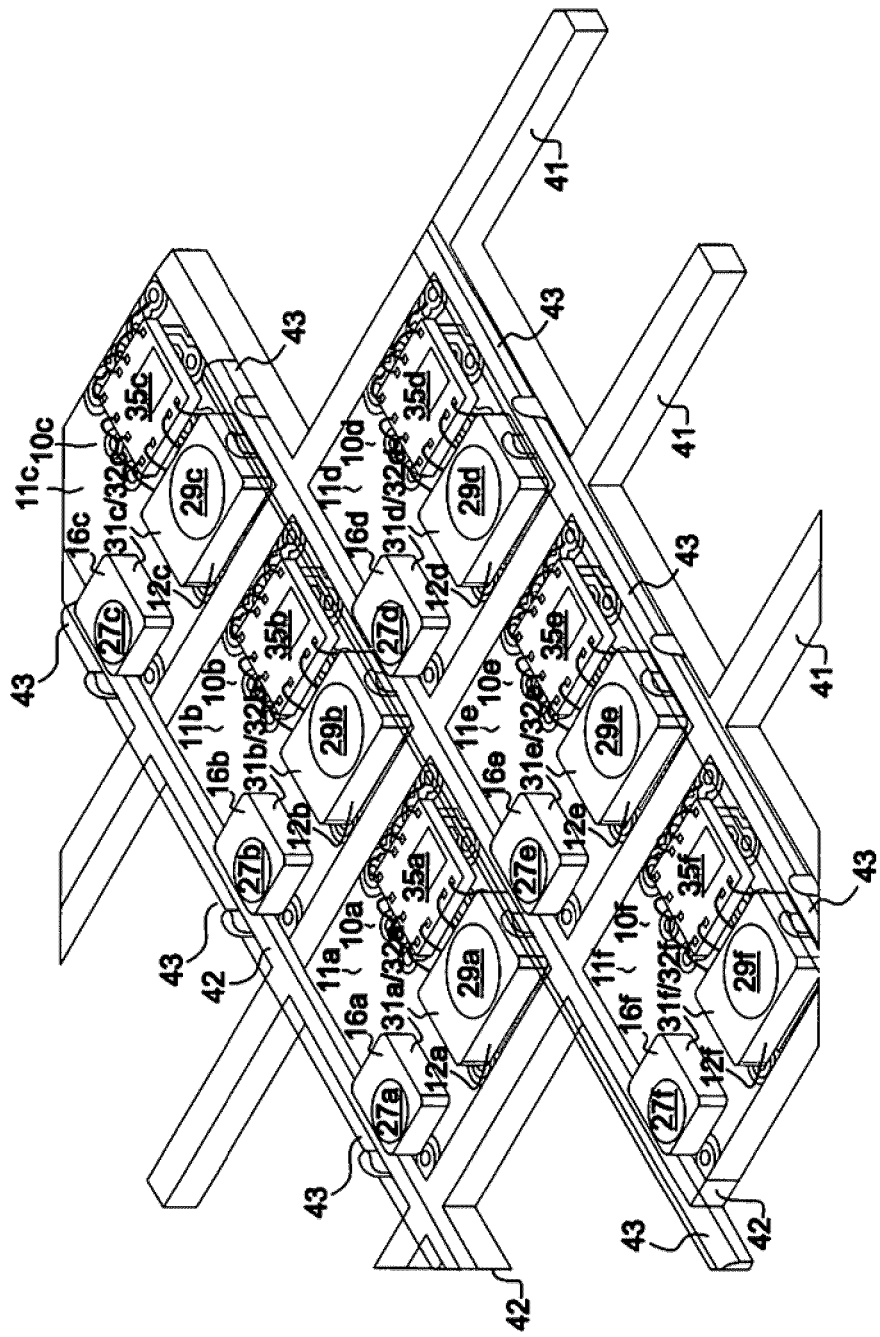
Figure 9D:
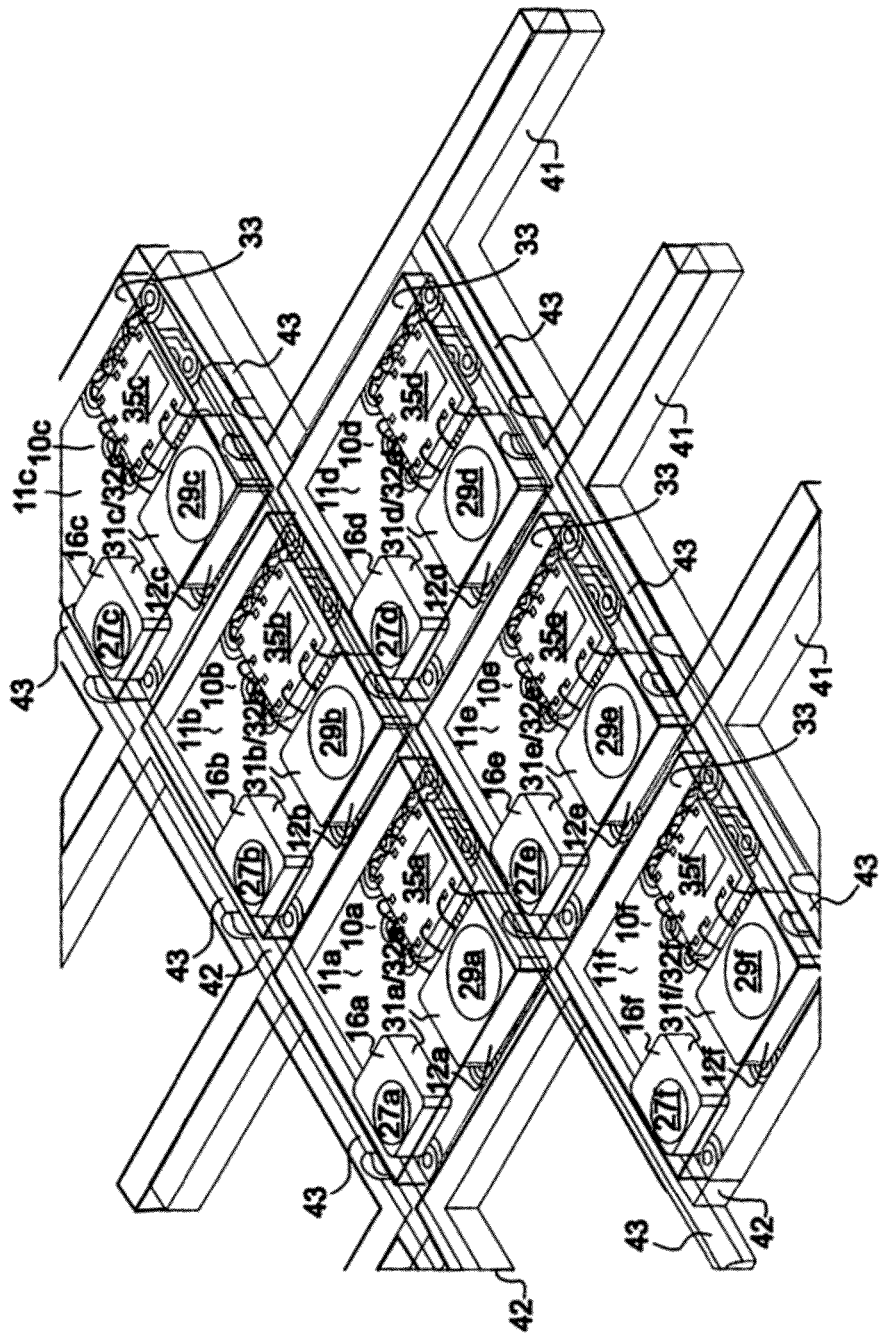

Referring now to FIGS. 9(a) through 9(d), there is shown another method of making proximity sensor 10 according to one embodiment. As shown in FIG. 9(a), a plurality of PCB substrates 11a through 11f are provided on panel 41/42 with light emitter dice 12a through 12f and light detector dice 16a through 16f attached and then wire-bonded thereto. In FIG. 9(b), light emitter dice 12a through 12f and light detector dice 16a through 16f are overmolded using transfer molding techniques with a suitable optically-transmissive material to form first and second optically transmissive infrared light pass components 31 and 32 and lenses 27a through 27f and 29a through 29f. As shown in FIGS. 9(b) through 9(d), note that mold runners 43 are provided to facilitate the distribution of the various molding materials to PCB substrates 11a through 11f. As shown in FIG. 9(c), light emitter driver integrated circuits 35a through 35f containing integrated ambient light sensors 14 are attached to PCB substrates 11a through 11f, and then wirebonded thereto. In FIG. 9(d), the entire PCB panel 41 is sheet cast using a suitable infrared cut, filter or block material to form substantially optically non-transmissive infrared light barrier components 33a through 33f between first and second optically transmissive infrared light pass components 31a through 31f and 32a through 33f. Finally (not shown in the Figures), individual proximity sensors 10a through 10f are singulated by, for example, using sawing techniques well known to those skilled in the art, where mold runners 43 are also removed.

Figure 10:
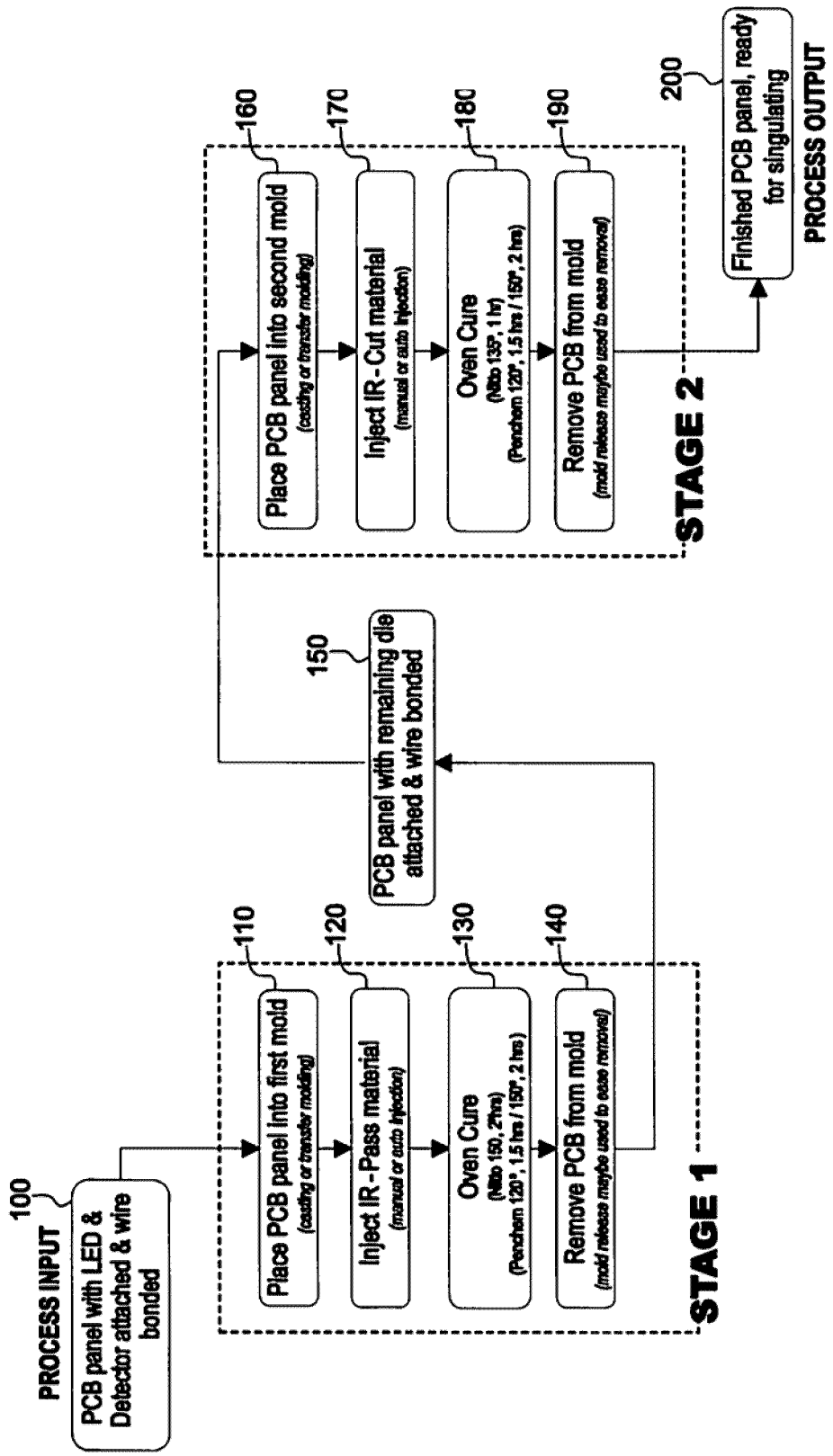
FIG. 10 shows yet another method of making an optical proximity sensor according to one embodiment.

FIG. 10 shows yet another method of making an optical proximity sensor 10 according to one embodiment. As shown in FIG. 10, at process input 100 a PCB panel having LED dice 16 and light detector dice 12 attached and wirebonded to individual substrates 11 mounted on the panel are provided. At step 110, the PCB panel is placed in a first mold configured to permit casting or transfer molding. At step 120, the infrared pass material is manually or automatically injected into the first mold to form the first and second molded optically-transmissive components 31 and 32 over light emitter dice 16 and light detector dice 12 for each of proximity sensors 10. Next, at step 130 the infra-red pass molded materials are oven cured for the requisite period of time at the required temperature. At step 140, the PCBs are removed or released from the first mold. Next, at step 150 the overmolded PCB panel with the remaining dice attached and wire-bonded to the individual PCB substrates is prepared for step 160, where the PCB panel is placed in a second mold. At step 170 the infrared cut material is manually or automatically injected into the second mold to form the substantially optically non-transmissive light barriers 33 disposed between first and second molded optically-transmissive components 31 and 32 for each of proximity sensors 10. Next, at step 180 the infra-red cut barrier molded materials are oven cured for the requisite period of time at the required temperature. At step 190, the PCBs are removed or released from the second mold. At step 200 the finished PCB panel is prepared for singulating the individual proximity sensors 10 from the PCB panel.

Included within the scope of the present invention are methods of making and having made the various components, devices and systems described herein.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. An optical proximity sensor, comprising:
    a substrate;
    an infrared light emitter mounted on the substrate and operably connected to and driven by a light emitter driving circuit;
    a light detector also mounted on the substrate and operably connected to and driven by a detector sensing circuit;
    a first molded optically transmissive infrared light pass component disposed over and covering the light emitter;
    a second molded optically transmissive infrared light pass component disposed over and covering the light detector, wherein the second component is discrete and separate from the first component; and
    a molded substantially optically non-transmissive infrared light barrier component disposed between and separating the first and second optically transmissive infrared light pass components, wherein the infrared light barrier component, first component, and second component are mounted on a common surface of the substrate, wherein the infrared light barrier component is molded to the first component and the second component, and wherein the infrared light barrier component further covers the light emitter driving circuit and the detector sensing circuit;
    wherein at least a first portion of light emitted by the light emitter passes through the first component, and at least a second portion of the first portion of light reflected from an object of interest in proximity to the sensor passes through the second component for detection by the light detector, and the infrared light barrier component substantially attenuates or blocks the transmission of undesired direct, scattered or reflected light between the light emitter and the light detector and thereby minimizes optical crosstalk and interference between the light emitter and the light detector.

2. The optical proximity sensor of claim 1, wherein at least one of the first and second infrared light pass components comprises an optically transmissive epoxy, polymer or plastic.

3. The optical proximity sensor of claim 1, wherein the first and second infrared light pass components and the infrared light barrier component are configured to bond to one another, and bonds formed therebetween do not delaminate under normal operating conditions.

4. The optical proximity sensor of claim 1, wherein the infrared light barrier component covers substantially all of the common surface of the substrate that is not covered by the first component and the second component and wherein the infrared light barrier component comprises a substantially optically non-transmissive moldable material, epoxy, polymer or plastic.

5. The optical proximity sensor of claim 1, wherein the infrared light barrier component further comprises an infrared cut or blocking additive.

6. The optical proximity sensor of claim 1, further comprising a substrate upon which the light emitter and the light detector are operably mounted.

7. The optical proximity sensor of claim 6, wherein the substrate is a printed circuit board ("PCB").

8. The optical proximity sensor of claim 1, wherein at least one of the light emitter and light detector is a semiconductor die.

9. The optical proximity sensor of claim 1, further comprising at least one integrated circuit operably connected to the light emitter and the light detector, and configured to control the operation of the light detector and the light detector, and to process output signals provided by the light detector.

10. The optical proximity sensor of claim 9, wherein the at least one integrated circuit further comprises a proximity sensor application specific integrated circuit (ASIC) and a master control unit (MCU).

11. The optical proximity sensor of claim 1, further comprising an ambient light sensor.

12. The optical proximity sensor of claim 1, wherein the optical proximity sensor is incorporated into a portable electronic device.

13. The optical proximity sensor of claim 11, wherein the portable electronic device is a mobile telephones a personal data assistant (PDA), a laptop computer, a notebook computer, or a computer.

14. The optical proximity sensor of claim 1, wherein the light emitter is an LED.

15. The optical proximity sensor of claim 1, wherein the light detector is a positive-intrinsic-negative ("PIN") diode.

16. The optical proximity sensor of claim 1, wherein a molded optically transmissive lens is formed over the light emitter or the light detector.

17. A method of making an optical proximity sensor, comprising:
    mounting an infrared light emitter on a substrate;
    mounting an infrared light detector on the substrate, the infrared light detector being spaced apart from the infrared light emitter on the substrate;
    molding or casting a first optically transmissive infrared light pass component over and covering the light emitter;
    molding or casting a second optically transmissive infrared light pass component over and covering the light detector, the second optically transmissive infrared light pass component being discrete and separate from the first optically transmissive infrared light pass component;
    molding or casting a substantially optically non-transmissive infrared light barrier component between the discrete first and second optically transmissive infrared light pass components thereby separating the first and second optically transmissive infrared light pass components, wherein the infrared light barrier component is molded to the first component and the second component, and wherein the infrared light barrier component extends to at least one border of the substrate; and
    bonding the substantially optically non-transmissive infrared light barrier component to the first and second optically transmissive infrared light pass components.

18. The method of claim 17, wherein the first and second optically transmissive infrared light pass components are molded or casted in the same step and wherein the substantially optically non-transmissive infrared light barrier component is bonded to the first and second optically transmissive infrared light pass components during the molding or casting of the substantially optically non-transmissive infrared light barrier component.

19. The method of claim 17, wherein optically transmissive lenses are formed over the light emitter and the light detector when the first and second optically transmissive infrared light pass components are molded or casted.

20. The method of claim 17, wherein the light emitter or the light detector is die-attached to the substrate.

21. The method of claim 17, wherein the light emitter or the light detector is wire-bonded to the substrate.

22. The method of claim 17, wherein the first and second optically transmissive infrared light pass components are transfer-molded.

23. The method of claim 17, further comprising forming light guides when the first and second optically transmissive infrared light pass components are molded or casted.

24. The method of claim 17, further comprising attaching a light emitter driver integrated circuit comprising an ambient light sensor to the substrate.

25. The method of claim 17, wherein molding or casting the substantially optically non-transmissive infrared light barrier component further comprises sheet casting the light barrier component.

26. The method of claim 17, wherein the resulting molded optical proximity sensor is singulated by sawing.

27. The method of claim 17, wherein a plurality of proximity sensors are formed on a panel simultaneously.

* * * * *